United States Patent [19]
Diba et al.

[11] Patent Number: 5,719,506
[45] Date of Patent: Feb. 17, 1998

[54] FAST SIGNAL PATH FOR PROGRAMMABLE LOGIC DEVICE

[75] Inventors: Sholeh Diba, Los Gatos; Hy V. Nguyen, San Jose, both of Calif.

[73] Assignee: Xilinx, Inc., San Jose, Calif.

[21] Appl. No.: 533,884

[22] Filed: Sep. 26, 1995

[51] Int. Cl.$^6$ .................. H03K 7/38; H03K 19/0175
[52] U.S. Cl. ......................................... 326/39; 326/86
[58] Field of Search ........................ 326/39, 83, 86, 326/106, 111

[56] References Cited

U.S. PATENT DOCUMENTS

| | | |
|---|---|---|
| 4,871,930 | 10/1989 | Wong et al. . |
| 5,034,634 | 7/1991 | Yamamoto ........................ 326/39 |
| 5,128,560 | 7/1992 | Chern et al. ...................... 326/83 |
| 5,140,193 | 8/1992 | Freeman et al. .................. 326/39 |
| 5,151,622 | 9/1992 | Thrower et al. .................. 326/83 |
| 5,268,598 | 12/1993 | Pedersen et al. . |
| 5,300,830 | 4/1994 | Hawes . |
| 5,359,573 | 10/1994 | Wang ................................ 365/185 |
| 5,362,999 | 11/1994 | Chiang ............................. 326/44 |
| 5,365,125 | 11/1994 | Goetting et al. .................. 326/39 |
| 5,467,033 | 11/1995 | Yip et al. .......................... 326/93 |
| 5,486,778 | 1/1996 | Lou .................................. 326/83 |

*Primary Examiner*—Edward P. Westin
*Assistant Examiner*—Richard Roseen
*Attorney, Agent, or Firm*—Jeanette S. Harms; Michael A. Glenn

[57] ABSTRACT

Propagation delay along a signal path in a programmable logic device is reduced by providing improved switching and buffering along the device signal path. Such improvement is achieved by providing a separate buffer for each signal path leading from a given device input pad. In this manner, the buffer is smaller without increasing net power consumption. Improved output drivers are also provided in which device sizes are optimized to sink/source larger amounts of current, thereby improving device speed. A feedback arrangement, including a bootstrap device, provides a path that augments the current provided within the output buffer, thereby assisting a low to high signal transition. An improved OR gate is also provided that precharges a gate output line to ensure fast state transition, while eliminating the need for complementary gate switching logic.

3 Claims, 8 Drawing Sheets

FAST SIGNAL PATH FOR PROGRAMMABLE LOGIC DEVICE

BACKGROUND OF THE INVENTION

1. Technical Field

The present invention relates to signal propagation along a signal path in a programmable logic device, and particularly to a fast signal path for a programmable logic device.

2. Description of the Related Art

Programmable logic devices (PLDs) typically make use of one or more interconnect arrays that can be programmed via an array of memory cells to make the various interconnections within the PLD that are specific to a desired design. During the last few years, improvements in PLD architecture have allowed the manufacture of more complex devices. A major limitation to increasing the functional density of PLDs is the interconnect array used to configure signal routing in the PLD. Typically, the size of the interconnect array increases as the square of the number of output functions provided by the PLD.

The programmable interconnect array introduces a significant speed limitation due to capacitive loading by the programmable elements used therein. Thus, increasing the size of the programmable interconnect array leads to higher power consumption and lower PLD speed. Therefore, as larger PLDs are designed, the programmable interconnect array becomes an increasingly critical, limiting factor.

Figure 1:
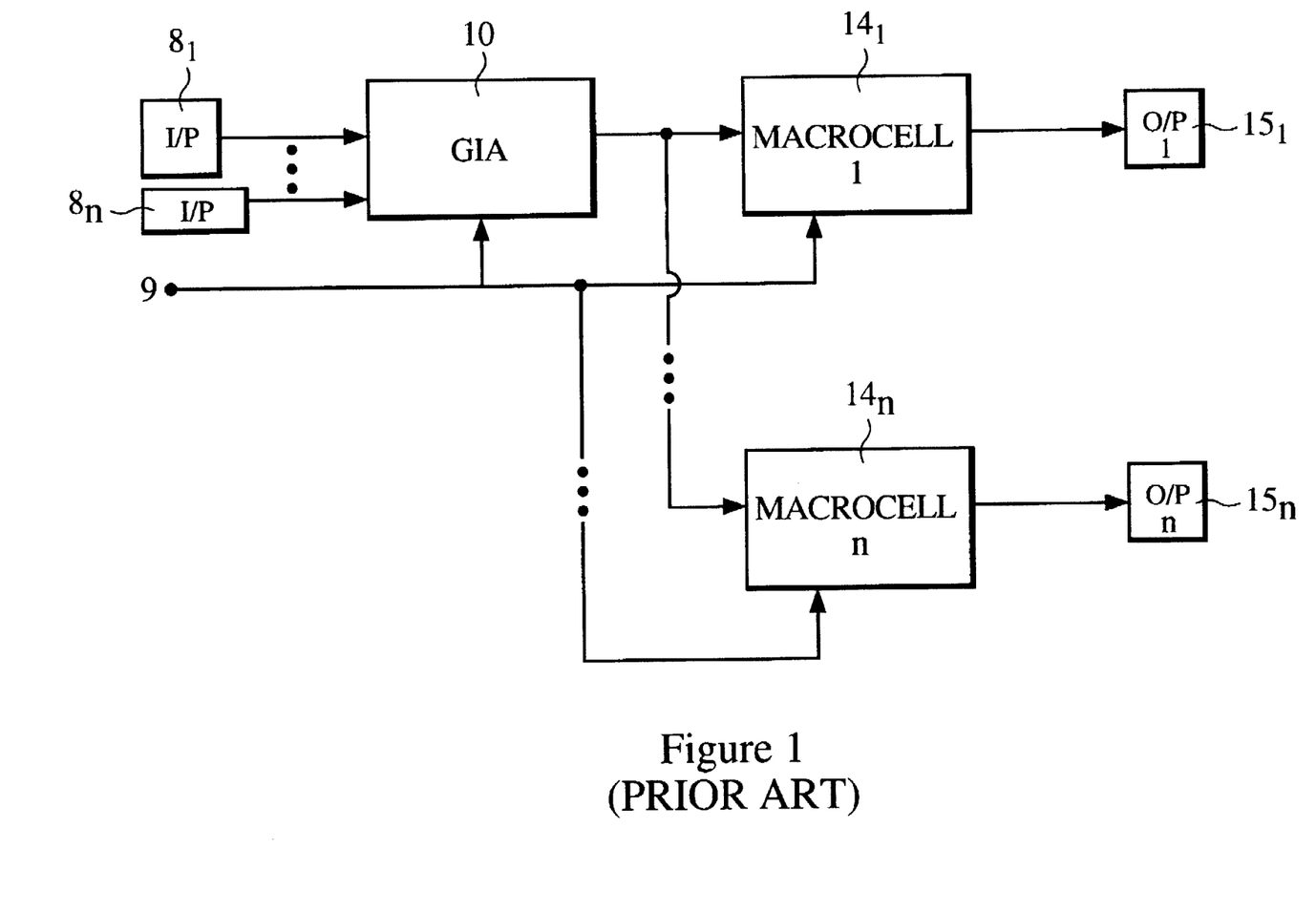
FIG. 1 is a block level schematic diagram of a prior art PLD architecture.

FIG. 1 is a block level schematic diagram of a conventional PLD architecture that includes a plurality of input pads $8_1$–$8_n$ connected to a global interconnect array (GIA) 10. In turn, GIA 10 is connected to a plurality of macrocells $14_1$–$14_n$, whose output signals are routed to output pads $15_1$–$15_n$ respectively. Thus, GIA 10 provides a programmable signal path between input pads $8_1$–$8_n$ and macrocells $14_1$–$14_n$. The signals on a plurality of dedicated input pins 9 (only one input pin being illustrated) are routed either to GIA 10 or to one or more of macrocells $14_1$–$14_n$.

Conventional PLDs have a typical signal propagation time of about 13.5 ns to 15.5 ns from input pads $8_1$–$8_n$ to output pads $15_1$–$15_n$. As PLDS become increasingly complex, delays along the signal path limit the ability of a designer to specify correspondingly complex logic functions. Additionally, continual improvements in processor speeds tax the ability of conventional PLDs to provide acceptable throughout. Accordingly, improvements in speed must continue to be made such that PLDs keep pace with modern, high speed processors.

Figure 2:
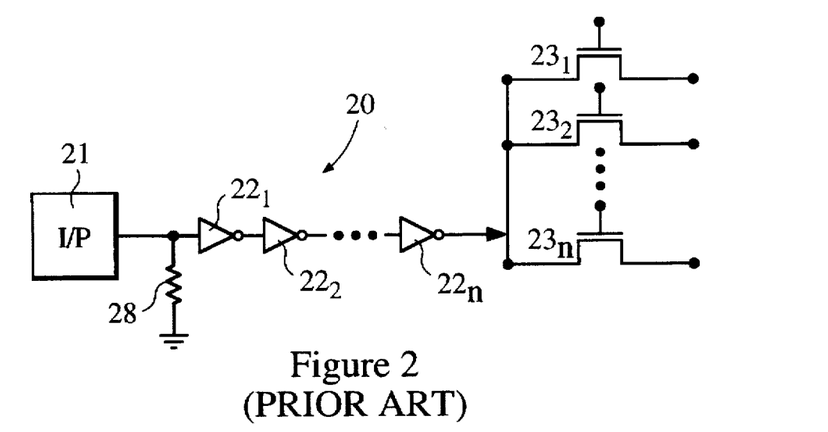
FIGS. 2, 3, and 4 are schematic diagrams of prior art input buffers for a PLD.
Figure 3:
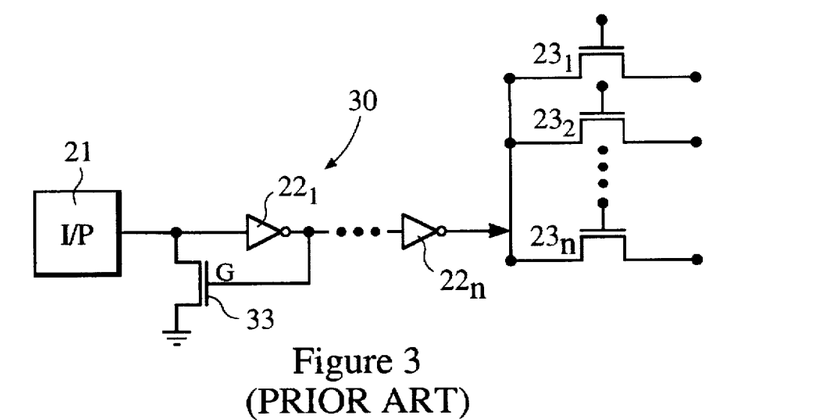
Figure 4:
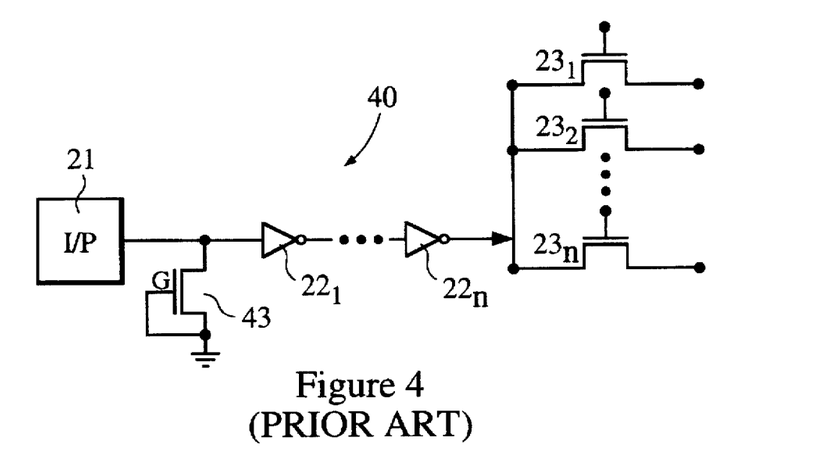

FIGS. 2, 3, and 4 illustrate three conventional designs of input buffer circuits. U.S. Pat. No. 5,329,174, which is incorporated herein by reference, shows additional input buffer circuit designs. Referring to FIG. 2, an input buffer circuit 20 includes an input pad 21 connected to a plurality of input buffers $22_1$–$22_n$ which are connected in series. The last input buffer, i.e. an inverter $22_n$, is connected in parallel to a plurality of transistors $23_1$–$23_n$. Transistors 23 and input buffers 22 form part of GIA 10 (FIG. 1). A pull down resistor 28 has one terminal connected between input pad 21 and buffer $22_1$ and another terminal connected to ground. Note that similar reference numerals in FIGS. 2, 3 and 4 indicate similar components.

FIG. 3 shows a buffer circuit 30 which includes a transistor 33, such as a FET, connected between input pad 21 and ground. The gate of transistor 33 is connected to the output terminal of input buffer $22_1$. In this feedback configuration, if the signal on gate G is high, transistor 33 is turned on, thereby clamping the signal of the input pad 21 to ground.

The input buffer circuit 40 of FIG. 4 includes a transistor 43, such as an N-channel MOS transistor, which has its gate G connected to ground. However, even though input buffers $22_1$–$22_N$ are connected in series, transistors $23_1$–$23_N$ are substantially driven only by input buffer $22_n$, thereby causing delay in the signal propagation. Therefore, it would be desirable to provide a new design for the input buffer circuits, to reduce the signal time along the signal path.

Figure 5:
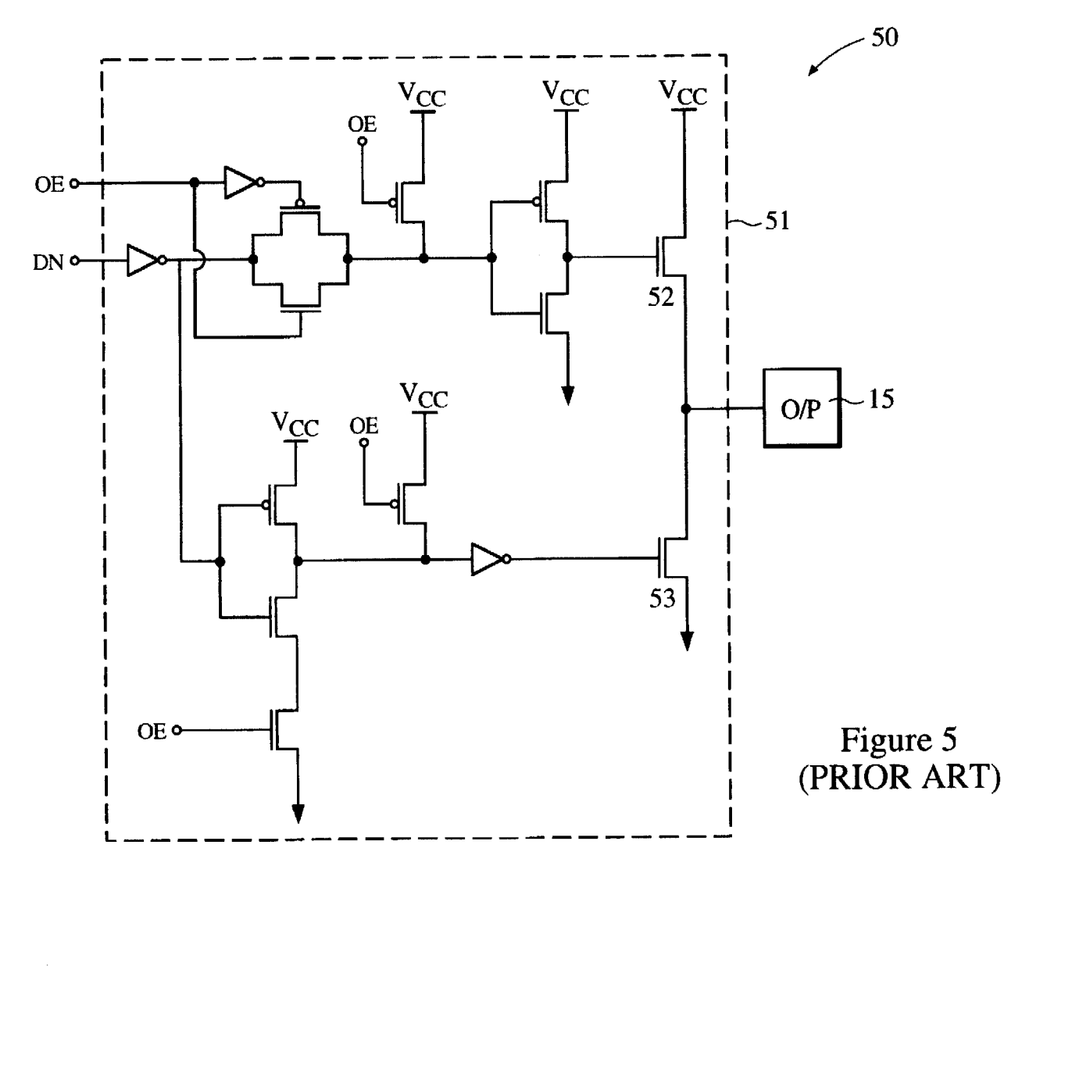
FIG. 5 is a schematic diagram of a prior art output buffer for a PLD.

FIG. 5 illustrates a conventional output driver 50 for a PLD. Output driver 50 includes an output buffer circuit 51, (which forms part of one macrocell 14), and one output pad 15. Note that a low output enable (OE) signal turns off output buffer circuit 51, whereas a high OE signal turns on the circuit and provides an output signal to output pin 15 having the same logic state as input signal DN. Because output buffer circuit 51 is well known in the art, its operation is not described in detail herein. U.S. Pat. No. 5,362,999, which is incorporated herein by reference, teaches that the speed of output circuit buffer 52 is increased by widening output transistors 52 and 53. However, this widening undesirably increases silicon area. Moreover, because PLDs include many output circuit buffers, this increase in silicon area quickly becomes unacceptable. Therefore, it would be desirable to further improve the PLD speed by optimizing the sizes of other components in the output driver without significantly increasing silicon area.

Figure 6:
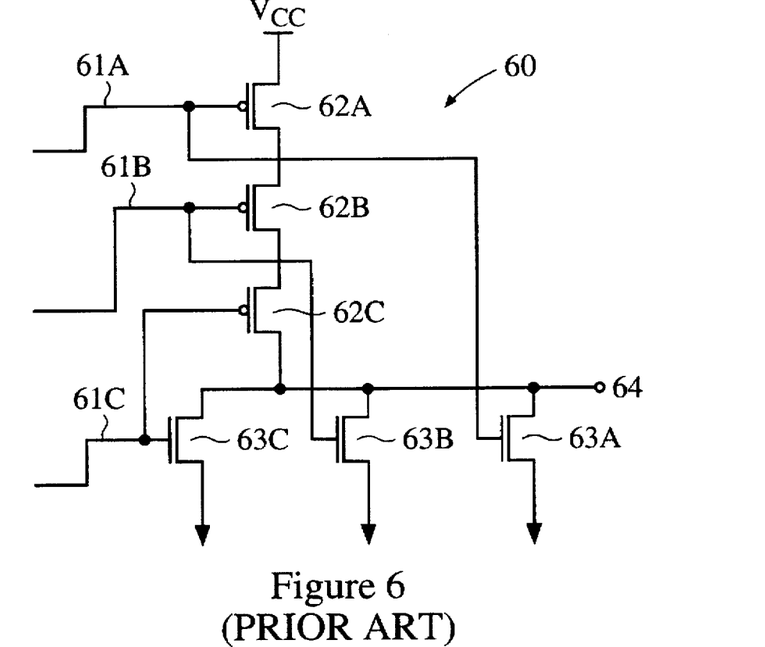
FIG. 6 is a schematic diagram of a prior art OR gate for a PLD.

FIG. 6 shows a conventional OR gate 60 which includes a plurality of input lines 61A, 61B, and 61C. In operation, if the signal on line 61A is high, pull-up transistor 62A turns off and pull-down transistor 63A turns on, thereby providing a low signal at an output terminal 64. Lines 61B and 61C operate in a similar manner. Consequently, for OR gate 60 to provide a high output signal all pull-up transistors 62A–62C need to be turned on, thereby adding to gate transition latency. Therefore, a need arises for an OR gate that switches quickly.

SUMMARY OF THE INVENTION

The invention provides a programmable logic device that includes a streamlined signal path having improved signal propagation speed. In one embodiment of the invention, an input buffer circuit includes an input pad and a plurality of input buffers connected in parallel to the input pad, wherein each input buffer is connected to a corresponding signal path. At least one input buffer includes a multiple stage amplifier circuit, wherein at least one of these stages includes a wide channel device that is capable of sinking/ sourcing a large amount of current, thereby providing faster device transitions.

In another embodiment of the invention, an output buffer circuit includes at least one wide channel device that is capable of sinking/sourcing a large amount of current, an output pad connected to the output buffer circuit, and a feedback path for sinking/sourcing a current to improve the signal propagation speed through the buffer.

In yet another embodiment, the PLD according to the present invention includes at least one OR gate comprised of a plurality of input inverters and a plurality of transistors that operate as logic switches. Specifically, the output terminal of each input inverter is connected to the gate of one transistor, whereas the drains of all transistors are connected to ground, and the sources of all transistors are connected to a common output line. The OR gate also includes a transistor that is connected to the common output line, and that is normally turned on to maintain the transistors at a predetermined potential below their threshold voltage, such that only a minimal amount of drive is required to drive selected transistors into saturation. In this manner, the OR gate of the present invention changes state quickly.

As a result of the foregoing improvements, the invention provides circuit enhancements that reduce signal propagation time along the signal path by about 5.5 ns, i.e. to about 8 to 10 ns total signal latency along the signal path.

DETAILED DESCRIPTION OF THE DRAWINGS

Figure 7:
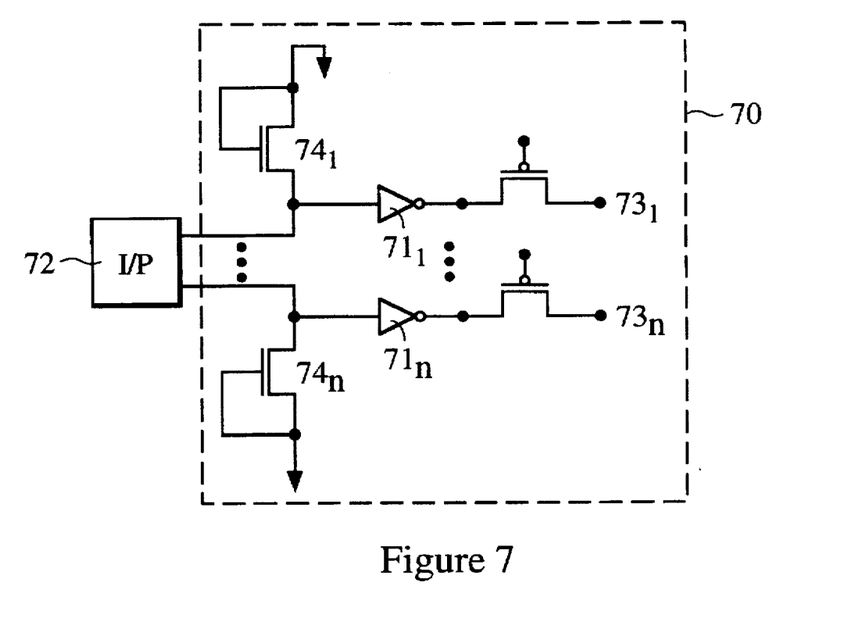
FIG. 7 is a schematic diagram of an input pad and input buffers for a PLD according to the invention.

FIG. 7 illustrates an input buffer circuit 70 in accordance with the present invention. Input buffer circuit 70 includes a plurality of input buffers (in this embodiment inventers) $71_1$–$71_n$ connected in parallel to an input pad 72. In accordance with the present invention, input buffers $71_1$–$71_n$ provide output signals that drive signal paths $73_1$–$73_n$, respectively. In this embodiment, input buffers 71 are identical, whereas in another embodiment, each signal path common to input pad 72 includes a buffer 71 having electrical characteristics that are unique to the line driven by the 35 buffer. In this embodiment, input buffer circuit 70 includes a plurality of transistors $74_1$–$74_n$, such as N-channel MOS transistors, which have their gates and drains connected to ground and their sources connected to the input terminals of their respective buffers 71.

Providing a separate input buffer 71 for each signal path 73 improves the signal propagation time of the PLD by about 1 nanosecond, in comparison to prior art input buffers 20, 30, or 40 (FIGS. 2, 3 or 4), because of lower per line loading. Moreover, because a single input buffer 71 drives a single signal path 73, input buffers 71 are smaller than prior art buffers 22, thereby decreasing the net power consumption. Furthermore, input buffer circuit 70 has a faster rise time than conventional input buffer circuits because of the decreased loading on each signal path 73, thereby contributing to the enhanced speed performance of the PLD.

Figure 8:
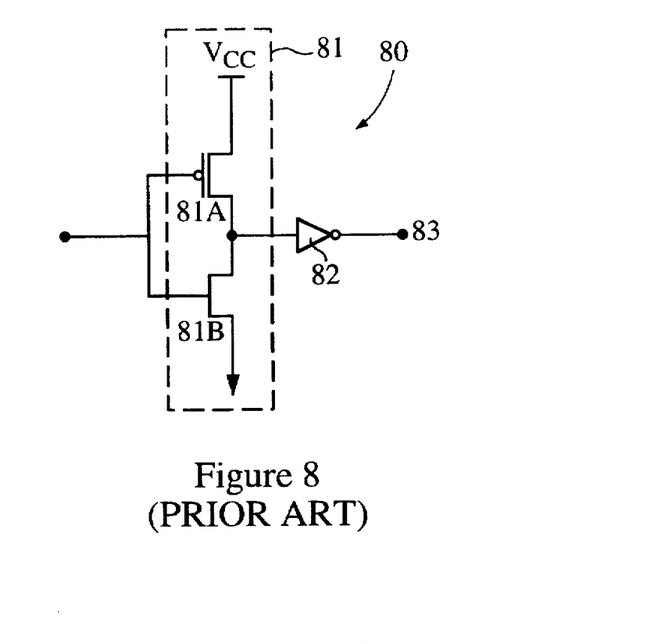
FIG. 8 is a schematic diagram of a prior art input buffer for a PLD.

FIG. 8 illustrates a known, two-stage amplifier circuit. The first stage comprises an inverter 81 consisting of a P-channel MOS transistor 81A, and an N-channel MOS transistor 81B. Input buffer circuit 80 also includes a second amplification stage, i.e. an inverter 82, which receives an output signal from inverter 81 and provides an output signal on node 83. In this circuit, one of the two amplifier stages includes one or more wide channel devices that are capable of sinking/sourcing a large amount of current, thereby provide faster switching. In one embodiment, transistor 81A is configured as a large current source, and has a preferred width of 500 µm, as opposed to a typical width of 100 µm. Amplifier stage 81 is capable of sourcing several times the current of the conventional buffers 22 shown in FIGS. 2, 3, and 4.

Figure 9:
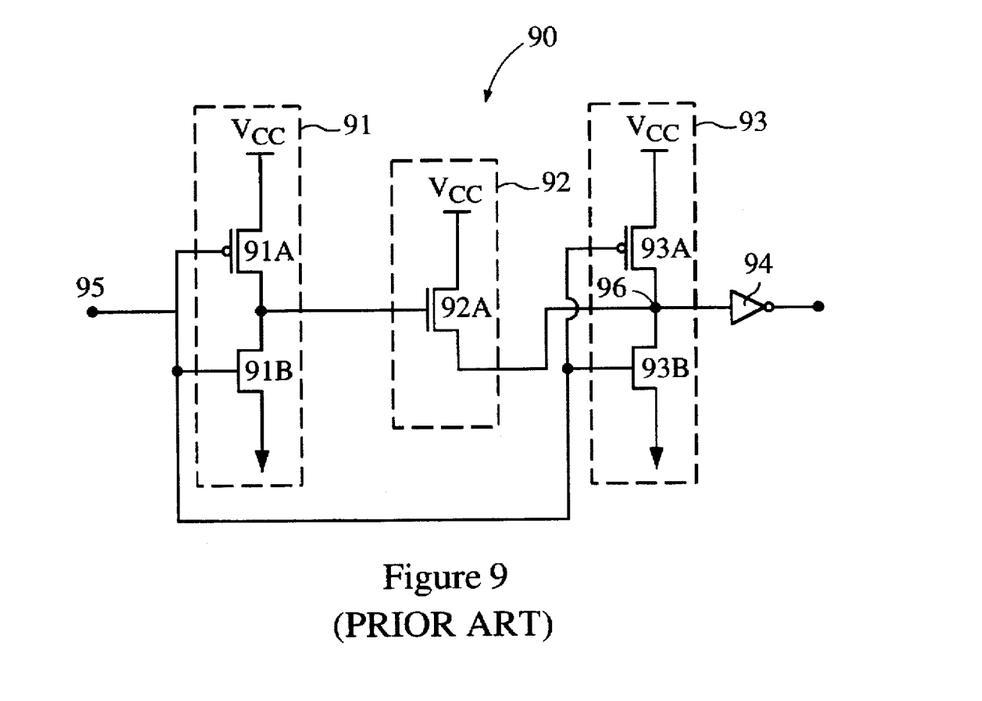
FIG. 9 is a schematic diagram of an input buffer for a PLD.

FIG. 9 illustrates a known multi-stage input buffer circuit 90. In this circuit, input buffer circuit 90 includes a plurality of amplification stages. A first amplification stage 91 includes an inverter 91 having a P-channel MOS transistor 91A, and an N-channel MOS transistor 91B. A second amplification stage 92 includes an N-channel MOS transistor 92A having a source connected to a power source Vcc, a gate connected to the drain of transistor 91A and the source of transistor 91B, and a drain connected to a third amplification stage 93.

The third amplification stage 93 includes an inverter 93 having a P-channel MOS transistor 93A and an N-channel MOS transistor 93B. In this embodiment, the drains of transistors 93A and 93B are coupled to the input terminal of an inverter 94. In one embodiment, inverter 94 is provided as a fourth amplification stage. The gates of transistors 91A, 91B, 93A, and 93B are all connected to an input terminal 95.

As with input buffer circuit 80 (FIG. 8), input buffer circuit 90 includes at least one stage having a wide channel device that is capable of sinking/sourcing a large amount of current, thereby providing faster signal transition. In one embodiment, transistor 91A has a width of 145 µm; transistor 91B has a width of 90 µm; and transistor 92A has a width of 220 µm. Moreover, transistor 92A ensures an additional pull-up on node 96 if a low signal is provided to amplification stages 91 and 93. Thus, compared to input buffer circuit 80, the present invention shown in FIG. 9 reduces the signal propagation time along the PLD signal path by about 1 nanosecond. Furthermore, because an N-channel device is stronger than a P-channel device, the use of transistor 92A (an N-channel device) rather than a P-channel device to provide the additional pull-up minimizes the increase in valuable chip area.

Figure 10:
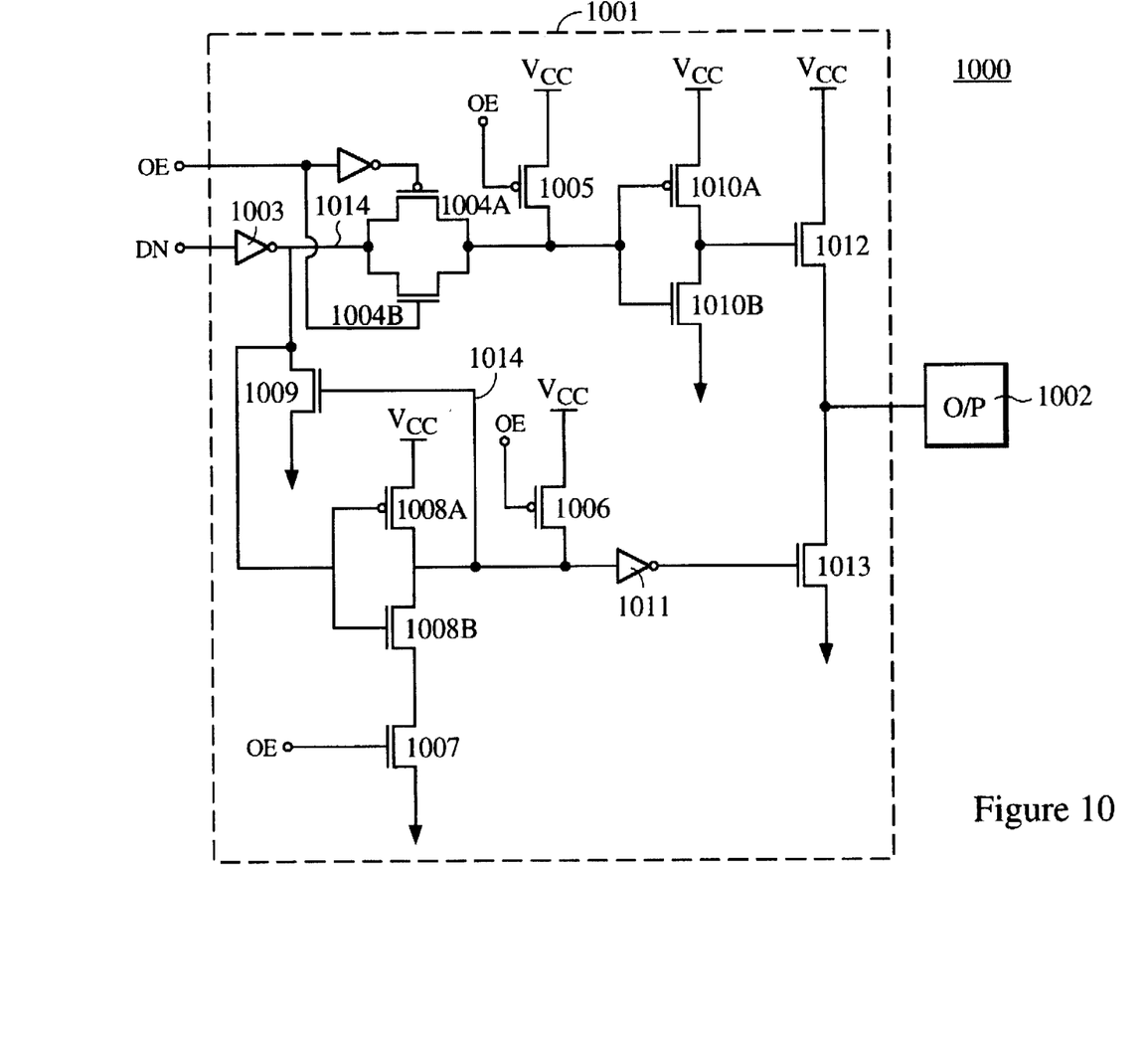
FIG. 10 is a schematic diagram of an output driver for a PLD according of the invention.

FIG. 10 illustrates an output driver 1000 which includes an output buffer circuit 1001 and an output pad 1002. Output buffer circuit 1001 is enabled by providing a high input signal OE to the device. This high OE signal turns on transistors 1004A and 1004B, thereby allowing an inverted input signal DN to be transferred to the gates of transistors 1010A and 1010B. Note that a high OE signal turns off transistors 1005 and 1006, but turns on transistor 1007.

In an enabled state, if a high input signal DN is provided to output buffer circuit 1001, transistors 1010A and 1008A are turned on, whereas transistors 1010B and 1008B are turned off. This configuration provides a high signal to the input terminal of inverter 1011 which in turn provides a logic low signal to the gate of transistor 1013, thereby turning off that transistor. Because of the low signal provided to the gates of transistors 1010A and 1010B, a high signal is provided to the gate of transistor 1012, thereby turning on this transistor and providing a high signal to output pad 1002.

On the other hand, if a low input signal DN is provided to output buffer circuit 1001 in an enabled state, transistors 1010A and 1008A are turned off, whereas transistors 1010B and 1008B are turned on, thereby providing a low signal to the gate of transistor 1012 (turning off this device) and providing a low signal to the input terminal of inverter 1011, thereby ensuring a high signal to the gate of transistor 1013. Transistor 1013 in its conducting state provides a low signal to output pad 1002. Thus, input buffer circuit 1001, in its enabled state, amplifies the input signal DN.

To improve the PLD speed, the sizes of the devices in output buffer circuit 1001 are optimized. Specifically, pull-up transistor 1012 is sized larger than pull-down transistor 2013, thereby causing the PLD to turn on faster. To this end, transistor 1012 is formed approximately 300 μm to 600 μm wide, whereas pull-down transistor 1013 is sized approximately 400 μm to 700 μm wide.

In accordance with one embodiment of the present invention, output driver 1000 further includes a feedback path 1014 that further improves the PLD signal propagation speed by sinking a current if the input signal DN is high. Specifically, inverter 1003 inverts that high signal and provides a low signal to the gates of transistor 1008A, thereby turning on that transistor and transfering a high signal via feedback line 1014 to the gate of a clamp transistor 1009. Clamp transistor 1009 then turns on and pulls line 1014 to ground. This current sink advantageously provides an additional pull-down to that provided by inverter 1003, thereby ensuring that the voltage on line 1014 (which is then transferred to inverter 1011 as described above) transitions from low to high rapidly.

If a low input signal OE is provided, output driver 1000 is disabled. Specifically, transistors 1004A, 1004B, 1007, 1010A, and 1012 are turned off, thereby ensuring that any input signal provided to output driver 1000 will not generate any current in the device.

Figure 11:
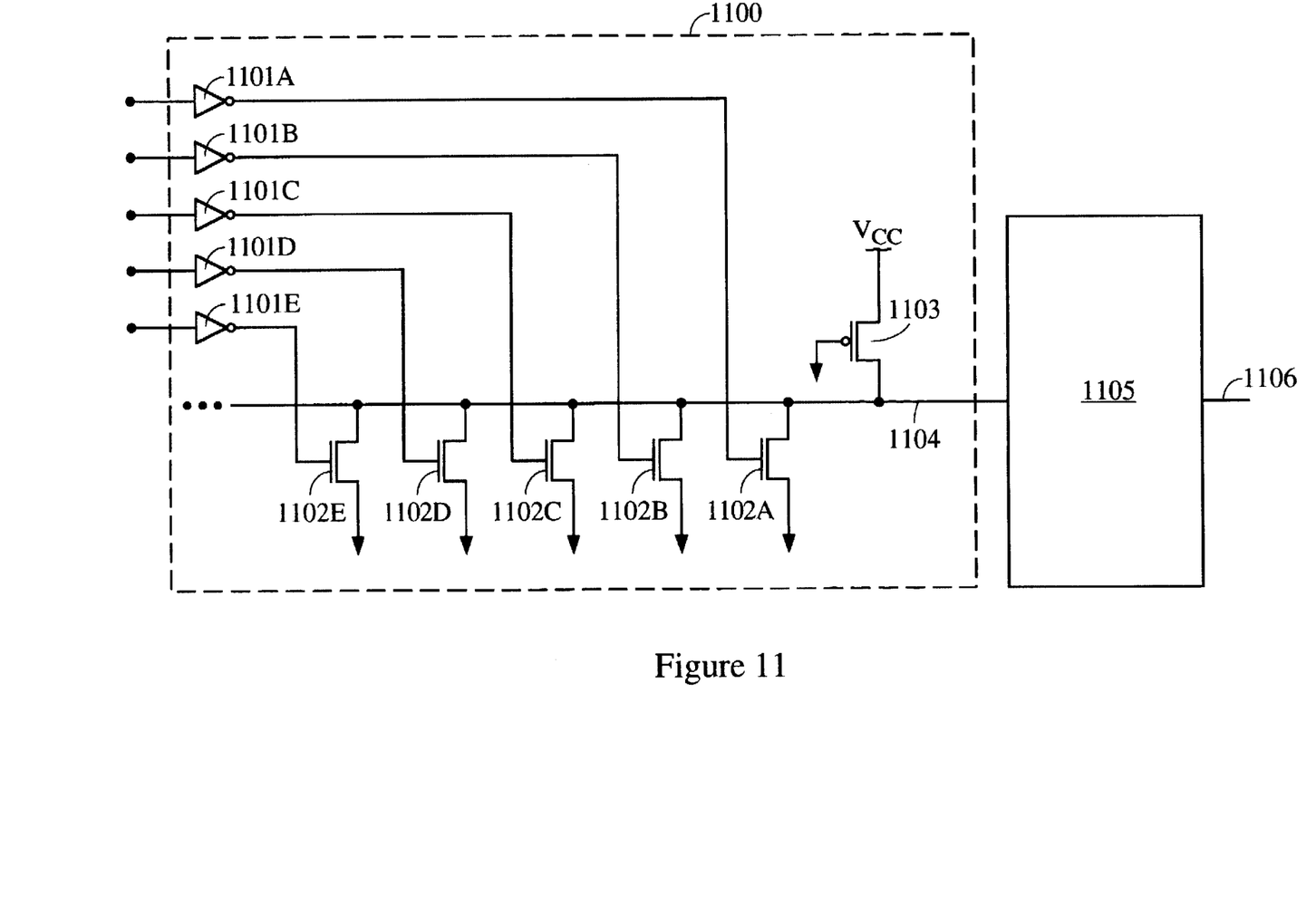
FIG. 11 is a schematic diagram of an OR gate for a PLD according to the invention.

FIG. 11 is a schematic diagram of an OR gate 1100 according to the invention which includes a plurality of inverters 1101A–1101E which provide control signals to the gates of transistors 1102A–1102E, respectively. The drains of transistors 1102A–1102E are connected to ground, whereas the sources of these transistors are connected to a common output line 1104.

OR gate 1100 further includes a P-channel MOS transistor 1103 having its drain connected to common output line 1104, its source connected to voltage source Vcc, and its gate coupled to ground, thereby maintaining the source-to-drain potential of all transistors 1102 at a predetermined potential, i.e. just below their threshold voltage. In this configuration, only a small drive signal from one inverter 1101 turns on its associated transistors 1102 which in turn pulls down the voltage on common output line 1104. Thus, OR gate 1100 improves the propagation speed of a PLD by biasing each transistor to switch on with less drive signal. OR gate 1100 also reduces the complementary logic pair of prior art OR gates, such that only one transistor need switch to provide a logic transition. Specifically, if all input signals to OR gate 60 (FIG. 6) are low, all P-channel MOS transistors 62 must be turned on, whereas all N-channel MOS transistors 63 must be turned off (or vice versa for all high input signals). In other words, a turning on of one transistor of transistor pair 62 and 63 neccesitates the turning off of the other transistor in the pair. In contrast, the present invention, provides an OR gate structure in which the state of only one transistor, i.e. one of NMOS transistors 1102, need be changed to alter the output value of OR gate 1100. As described previously, PMOS transistor 1103 is on all the time. Thus, because the state of only transistor is changed, the present invention significantly increases the speed of the logic gate in comparison to prior art OR gate 60.

In one embodiment, P-channel MOS transistor 1103 is sized relative to that of N-channels transistors 1102 by a factor N, wherein N is greater than or equal to 2. For example, if P-channel transistor 1103 has a width of 4 μm, then N-channel transistors 1102 each have a width of 8 μm. In this manner, N-channel transistors 1102 are able to pass four times as much current as P-channel transistor 1103.

Figure 12:
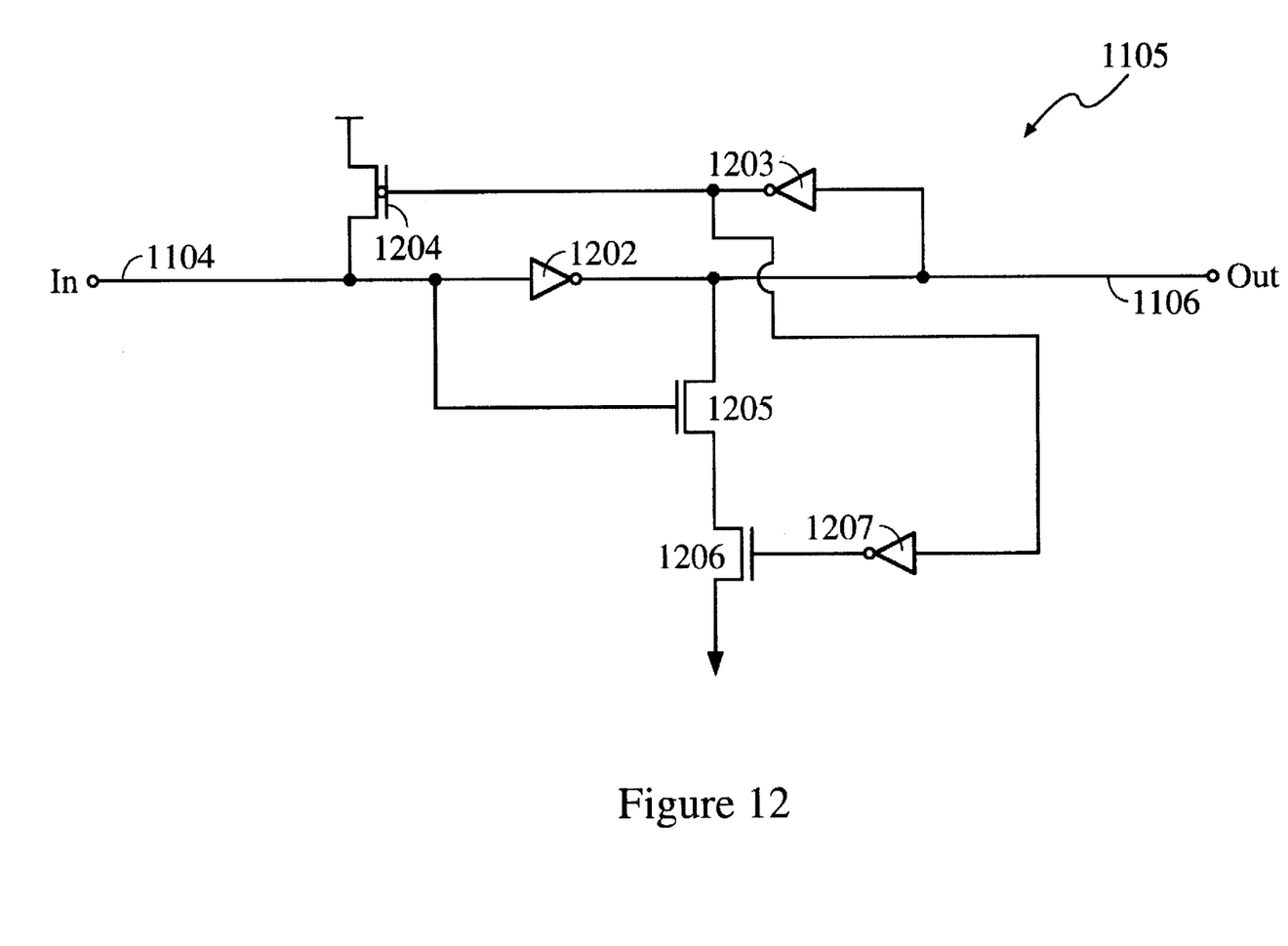
FIG. 12 is a schematic diagram of a buffer stage according to the invention for enhancing signal propagation time along a critical signal path.

FIG. 12 illustrates one embodiment of buffer stage 1105 (FIG. 11) for increasing signal propagation time along a critical signal path according to the invention. Buffer stage 1105 includes an inverter 1202 located on critical signal path 1106. If inverter 1202 drives a high level signal, for example to drive a signal along a long signal path, then inverter 1202 must move a significant amount of current, thereby degrading signal propagation time. In accordance with the present invention, buffer stage 1105 senses a transition across inverter 1202, and sources additional current to inverter 1202 (through an inverter 1203 and a current source transistor 1204), and provides a large current sink to inverter 1202 (through the current path established by conducting transistors 1205 and 1206, as driven by the input state transition signal and a feedback signal from an inverter 1207, respectively). Accordingly, the increased current path at either side of inverter 1202 reduces transition times, thereby improving signal propagation. In one embodiment, buffer stage includes the following transistor sizes: 1204 (5), 1202 (P:50,N:20), 1205 (50), 1206 (100), 1203 (P:4,N:4), and 127 (P:4,N:4).

Although the invention is described herein with reference to a number of embodiments, one skilled in the art will readily appreciate that embodiments other than those set forth herein do not depart from the spirit and scope of the present invention. Accordingly, the invention should only be limited by the Claims included below.

We claim:

1. An input buffer circuit for a programmable logic device, the input buffer circuit comprising:

an input pad; and a plurality of input buffers coupled in common to said input pad, each of said plurality of input buffers driving a corresponding separate line, wherein each of said input buffers further comprises:

a transistor having a gate and a drain coupled to a voltage source, and a source coupled to an input terminal of each buffer.

2. A programmable logic device comprising:

an input pad;

a plurality of input buffers coupled in common to said input pad, each of said plurality of input buffers driving a corresponding separate line;

an output buffer circuit comprising at least one channel device for sinking or sourcing a large current to provide a fast device transition;

an output pad coupled to said output buffer circuit;

a logic function block coupled between at least one of said plurality of input buffers and said output buffer; and a feedback path coupled to said output buffer circuit for sinking or sourcing an additional current to improve driver transition speed.

3. The programmable logic device of claim 2 wherein said logic function block includes an OR gate comprising:
- a plurality of input inverters, each having an input terminal and an output terminal;
- a plurality of transistor switches, each of which is coupled to a corresponding input inverter, said transistors each including a gate, a source and a drain; wherein said output terminal of each of said plurality of input inverters is coupled to said gate of a corresponding transistor; wherein said drain of said plurality of transistors is coupled to a circuit ground; wherein said source of said plurality of transistors is coupled to a common output line; and
- a switch coupled to said common output line for maintaining said transistors at a potential below a threshold voltage, wherein only a limited drive signal is necessary to drive said transistors into saturation.

* * * * *